United States Patent
Woo

(10) Patent No.: US 7,470,596 B2
(45) Date of Patent: Dec. 30, 2008

(54) CAPACITORS HAVING A HORIZONTALLY FOLDED DIELECTRIC LAYER AND METHODS FOR MANUFACTURING THE SAME

(75) Inventor: Hyuk Woo, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 268 days.

(21) Appl. No.: 11/287,675

(22) Filed: Nov. 28, 2005

(65) Prior Publication Data

US 2006/0141733 A1  Jun. 29, 2006

(30) Foreign Application Priority Data

Dec. 29, 2004  (KR) .................. 10-2004-0115642

(51) Int. Cl.
*H01L 21/20* (2006.01)
(52) U.S. Cl. .............. 438/393; 438/396; 257/E21.008; 257/E21.012
(58) Field of Classification Search .......... 438/396, 438/393; 257/532, 534
See application file for complete search history.

(56) References Cited

U.S. PATENT DOCUMENTS 5,994,197 A * 11/1999 Liao ..................... 438/396
2003/0001187 A1 * 1/2003 Basceri et al. .......... 257/301
2004/0042155 A1 * 3/2004 Ritter et al. ............. 361/309
2004/0161884 A1 * 8/2004 Lee et al. ................ 438/197
2005/0112851 A1 * 5/2005 Lee et al. ................ 438/497
2005/0133833 A1 * 6/2005 Tsui ........................ 257/288
2005/0206469 A1 * 9/2005 Lin et al. ................. 333/24.2
2007/0090456 A1 * 4/2007 Lee ......................... 257/347

* cited by examiner

Primary Examiner—Lex Malsawma
Assistant Examiner—Robert Huber
(74) Attorney, Agent, or Firm—Andrew D. Fortney

(57) ABSTRACT

Capacitors having a horizontally folded dielectric layer and methods of manufacturing is the same are provided. An example method for manufacturing a capacitor includes forming a first insulating layer pattern above a substrate, forming a first silicon epitaxial growth layer above a region of the silicon substrate exposed by the first insulating layer pattern through epitaxial growth of a first silicon layer, selectively etching the first insulating layer pattern, forming a dielectric layer pattern above the lateral surface of the first silicon epitaxial growth layer in a shape of a spacer, and forming a second silicon epitaxial growth layer above the silicon substrate through epitaxial growth of a second silicon layer. A capacitor including electrodes made of the first and second silicon epitaxial growth layers with the dielectric layer pattern formed therebetween may be formed by such a method.

5 Claims, 9 Drawing Sheets

CAPACITORS HAVING A HORIZONTALLY FOLDED DIELECTRIC LAYER AND METHODS FOR MANUFACTURING THE SAME

FIELD OF THE DISCLOSURE

The present disclosure relates generally to semiconductor fabrication and, more particularly, to capacitors having a horizontally folded dielectric layer and methods for manufacturing the same.

BACKGROUND

As capacitors with a high capacitance are required in the semiconductor device industry, various methods for enlarging an effective area of a capacitor's dielectric layer have been tried. For instance, an enlarged capacitor using an insulating layer has been formed by vertically folding it so as to enlarge the effective area of the insulating layer. The shapes of most capacitors, when seen from a horizontal view, are similarly formed, (for example, in box shapes).

Therefore, when large capacitors are designed, many limitations arise. For example, there may be reduced flexibly in using the remaining space of a wafer or forming the capacitors in a small area. That is, a change of a capacitor's shape in a vertical direction from a substrate may be realized, but it is difficult to horizontally form the capacitor in various shapes. Thus, there are limitations upon enlarging the effective area of a capacitor.

Figure 1:
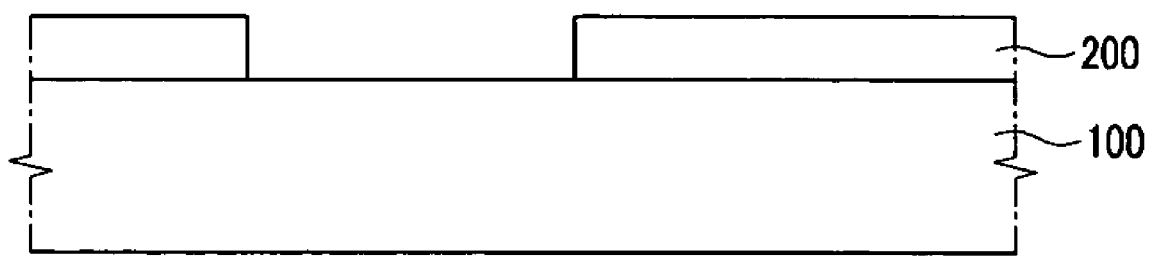
FIG. 1 to FIG. 8 are cross-sectional views illustrating an example method of manufacturing an example capacitor constructed in accordance with the teachings of the invention and having a horizontally folded dielectric layer.

To clarify multiple layers and regions, the thickness of the layers are enlarged in the drawings. Wherever possible, the same reference numbers will be used throughout the drawing (s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

In view of the state of the art described in the above background section of this patent, there is a need to provide a method for obtaining a larger effective area of a capacitor in a small space.

When example capacitors with a high capacitance are constructed in accordance with the teachings of the present invention, a large horizontal area may not be required, and the shape of the capacitor may be flexibly formed. Therefore, the example capacitors and the example methods of manufacturing the same disclosed herein may provide an improvement in usage of a wafer area and in flexibility of in the contact positions of the capacitor. In an example method disclosed herein, a vertically thin and deep dielectric layer is formed between silicon epitaxial growth layers using a silicon oxide and silicon epitaxial growth, and a horizontal shape of the dielectric layer may be flexibly formed. That is, by forming a horizontally folded dielectric layer on a substrate to improve flexibility of use of the remaining space, a capacitor with a higher capacitance may be formed in a small space.

FIG. 1 to FIG. 8 are cross-sectional views showing an example method of manufacturing an example capacitor having a horizontally folded dielectric layer. FIG. 9 is a perspective view illustrating a horizontally folded dielectric layer of an example capacitor constructed via the example method of FIGS. 1-8.

Referring first to FIG. 9, an example capacitor includes a dielectric layer pattern 650 on a silicon substrate, and two electrodes including two silicon epitaxial growth layers respectively formed at the left and right sides of the dielectric layer pattern 650. The dielectric layer pattern 650 is vertically formed to be horizontally folded. The dielectric layer pattern 650 may include a silicon oxide layer. The shape of the dielectric layer pattern 650 may be flexibly formed. For instance, it may be folded in a horizontal direction to form a zig-zag pattern. Sequential epitaxial growth of silicon is used to form the shape of the dielectric layer pattern 650.

Referring to FIG. 1, a first insulating layer pattern 200 is formed on a silicon substrate 100 by photolithography. The first insulating layer pattern 200 may include a silicon oxide layer. In addition, the lateral surface of the first insulating layer pattern 200 is formed to have protrusions and depressions so as to form the dielectric layer pattern (650 in FIG. 9) in a horizontally folded pattern.

Figure 2:
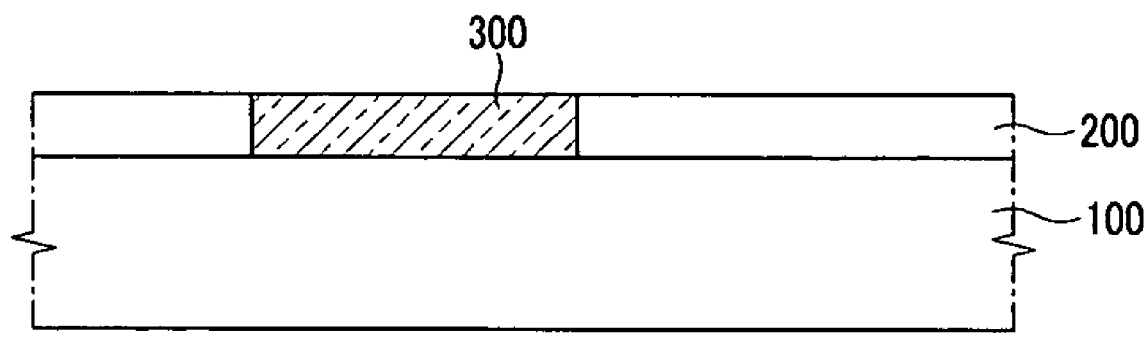

Referring to FIG. 2, an epitaxial growth process is performed to form a first silicon epitaxial growth layer 300 on a region of the silicon substrate 100 exposed by the first insulating layer pattern 200.

Figure 3:
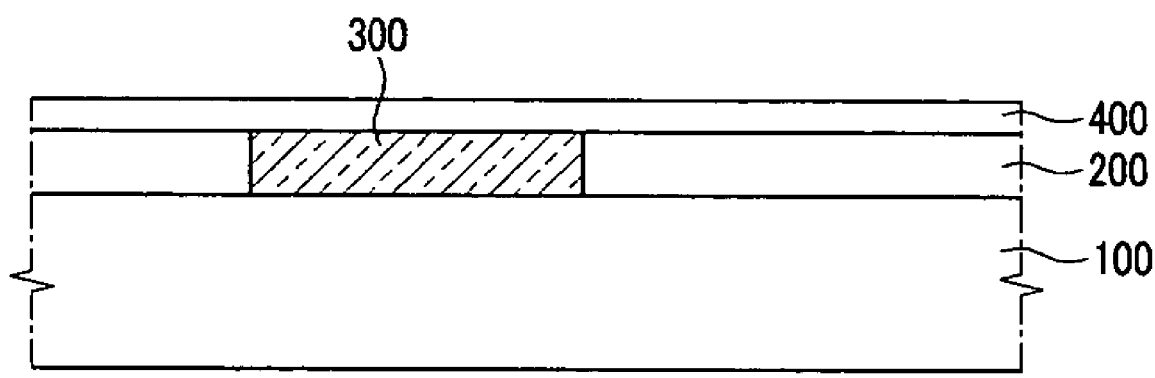

Referring to FIG. 3, a second insulating layer pattern 400 is formed. The second insulating layer pattern 400 covers the first silicon epitaxial growth layer 300 and the first insulating layer pattern 200. The second insulating layer pattern 400 may include a silicon oxide layer. In the illustrated example, the second insulating layer pattern 400 may be formed relatively thinner than the first insulating layer pattern 200.

Figure 4:
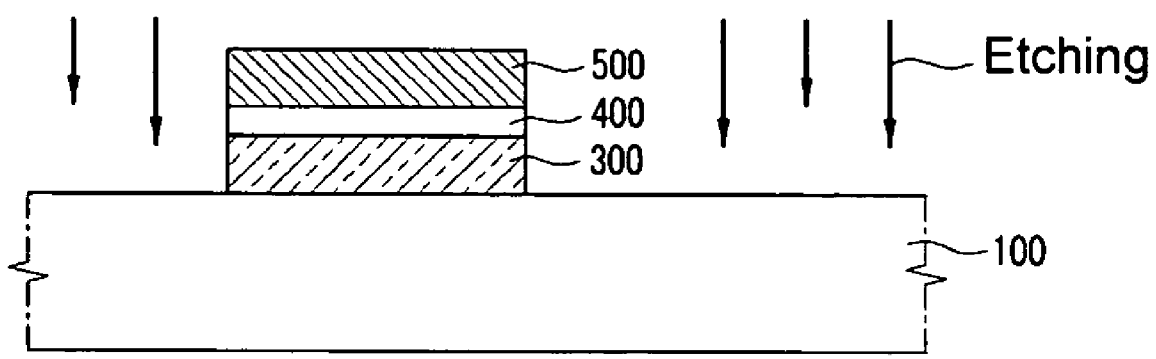

Referring to FIG. 4, a mask 500 is formed on the second insulating layer pattern 400 such that the first insulating layer pattern 200 is exposed. Next, the first insulating layer pattern 200 exposed by the mask 500 is selectively etched. Accordingly, the first insulating layer pattern 200 is removed, and the lateral surface of the first silicon epitaxial growth layer 300 is exposed.

Figure 5:
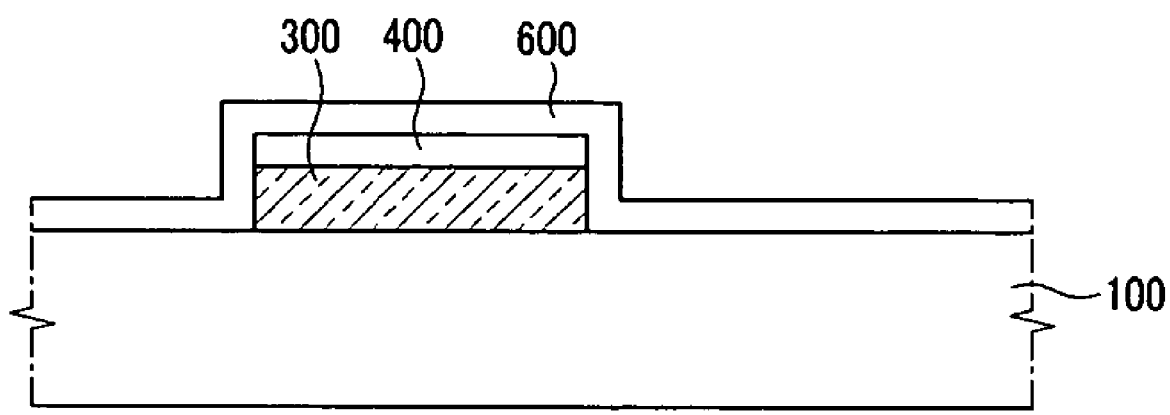

Referring to FIG. 5, after the mask 500 is removed, a dielectric layer 600 is formed so as to form a dielectric layer pattern on the exposed lateral surface of the first silicon epitaxial growth layer 300 in a shape of a spacer. The dielectric layer 600 may include a silicon oxide layer.

Figure 6:
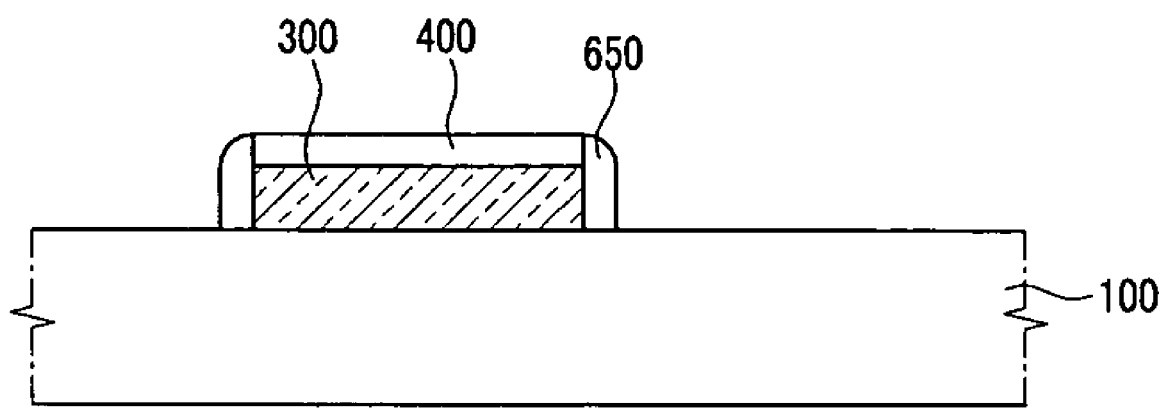

Referring to FIG. 6, a dielectric layer pattern 650 is formed by spacer etching (e.g., anisotropic dry etching) of the dielectric layer (600 in FIG. 5). The anisotropic dry etching is performed such that a surface of the silicon substrate 100 is exposed, and the second insulating layer pattern 400 remains on the first silicon epitaxial growth layer 300.

Figure 7:
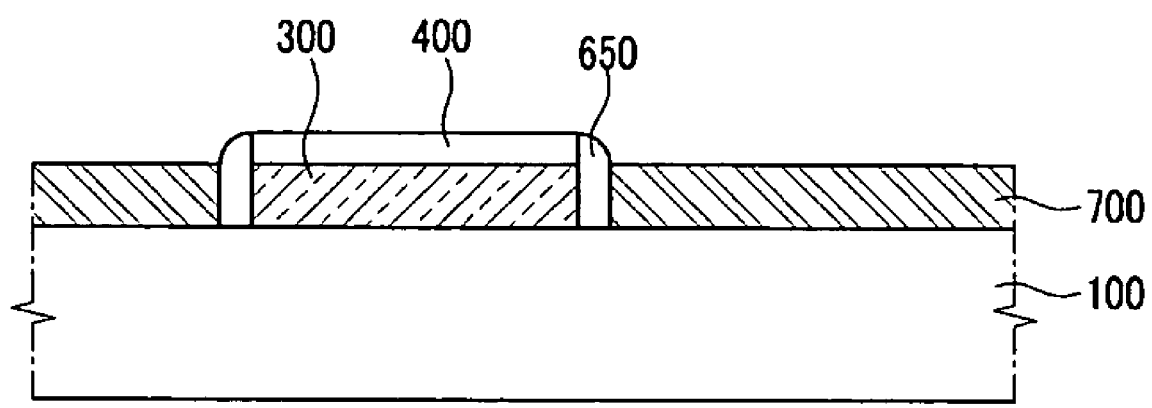

Referring to FIG. 7, through epitaxial growth of silicon, a second silicon epitaxial growth layer 700 is formed on a region of the silicon substrate 100 exposed by the dielectric layer pattern 650 and the second insulating layer pattern 400. In the illustrated example, the first and second silicon epitaxial growth layers 300 and 700 act as electrodes.

Figure 8:
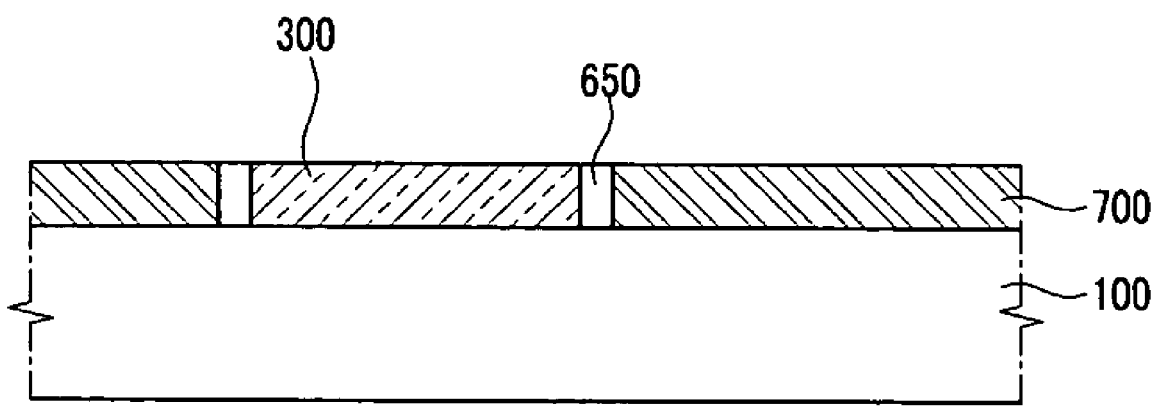
Figure 9:
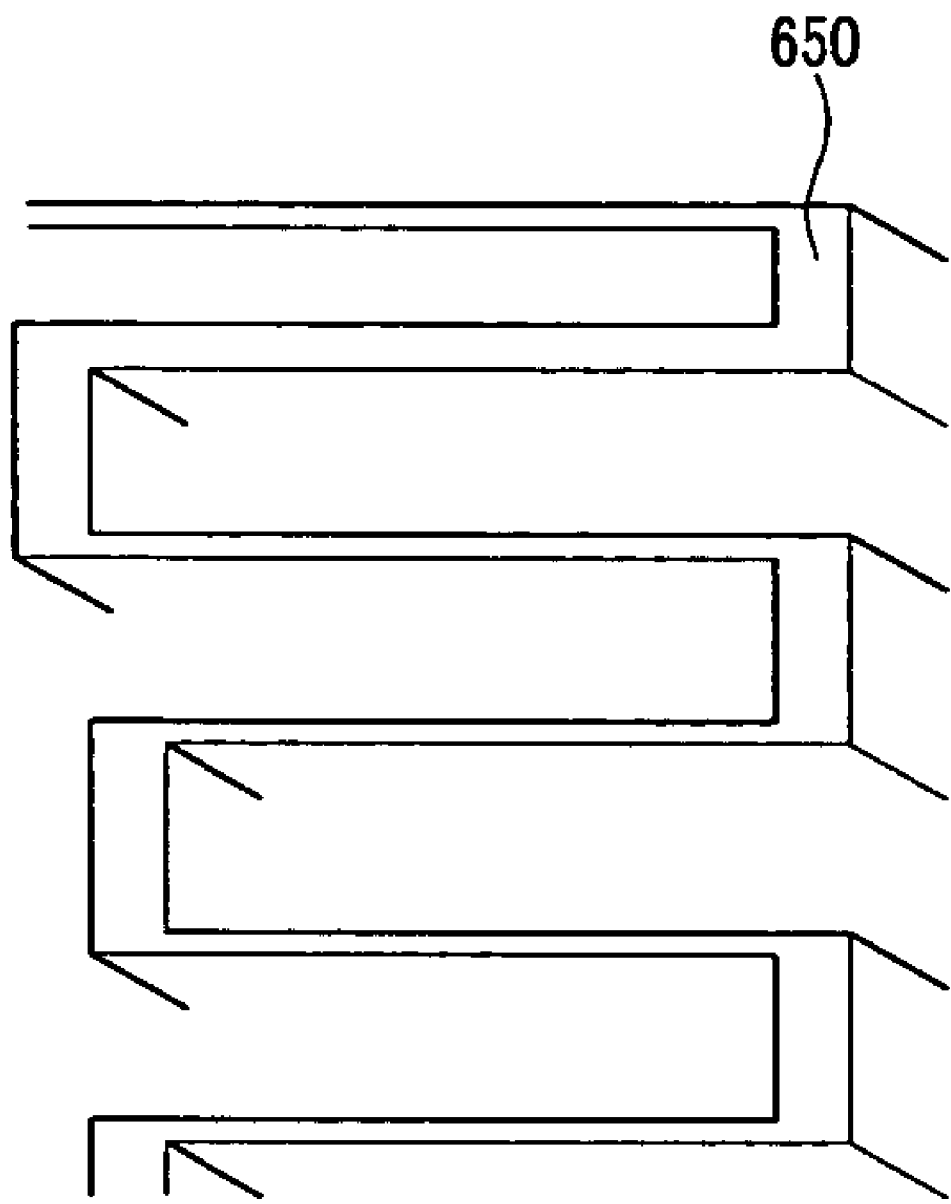
FIG. 9 is a perspective view illustrating a horizontally folded dielectric layer of an example capacitor constructed in accordance with the teachings of the present invention.

Referring to FIG. 8, the remaining second insulating layer pattern 400 is removed by an etching or polishing process.

As a result of the foregoing process, a capacitor including the dielectric layer pattern 650 and the first and second silicon epitaxial growth layers 300 and 700 is formed. The dielectric layer pattern 650 may be formed to be horizontally folded on the silicon substrate 100 when viewed from above, and the first and second silicon epitaxial growth layers 300 and 700 are formed at the left and right sides of the dielectric layer pattern 650 as electrodes.

From the foregoing, persons of ordinary skill in the art will readily appreciate that large capacitors whose shape may be flexibly formed on a horizontal surface have been disclosed. By vertically forming a thin and deep dielectric layer pattern between silicon epitaxial growth layers using a silicon oxide and silicon epitaxial growth process, various horizontal shapes of the dielectric layer pattern may be formed.

In view of the foregoing, persons of ordinary skill in the art will further appreciate that capacitors with a high capacitance in a small space and a method for manufacturing the same have been provided.

An example method for manufacturing a capacitor disclosed herein includes forming a first insulating layer pattern on a substrate, forming a first silicon epitaxial growth layer on a region of the silicon substrate exposed by the first insulating layer pattern through epitaxial growth of a first silicon layer, forming a second insulating layer pattern on the first insulating layer pattern and the first silicon epitaxial growth layer, forming a mask on the second insulating layer pattern such that the first insulating layer pattern is exposed, selectively etching the first insulating layer pattern exposed by the mask such that the lateral surface of the first silicon epitaxial growth layer is exposed, forming a dielectric layer pattern on the exposed lateral surface of the first silicon epitaxial growth layer in a shape of a spacer, and forming a second silicon epitaxial growth layer on a region of the silicon substrate exposed by the dielectric layer pattern and the first silicon epitaxial growth layer through epitaxial growth of a second silicon layer.

The lateral surface of the first insulating layer pattern may be formed in a shape with protrusions and depressions. As a result, the dielectric layer pattern may be formed such that it is folded in a zig-zag pattern on the silicon substrate when viewed from above. The zig-zag pattern may be positioned in a generally horizontal plane above the substrate.

After selectively etching the first insulating layer pattern, the second insulating layer pattern may still remain on the first silicon epitaxial growth layer until the second silicon epitaxial growth layer is formed.

The second insulating layer pattern protects the first silicon epitaxial growth layer during the forming of the dielectric layer pattern, and blocks the first silicon epitaxial growth layer during the second epitaxial growth. The second insulating pattern is removed after forming the second silicon epitaxial growth layer.

Forming the dielectric layer pattern may include forming a dielectric layer on the first silicon epitaxial growth layer and on the second insulating layer pattern, and anisotropically etching the dielectric layer such that the silicon substrate is exposed.

An example capacitor disclosed herein includes a dielectric layer pattern formed to be horizontally folded on a silicon substrate when viewed from above. It also includes first and second silicon epitaxial growth layers respectively formed at the left and right sides of the dielectric layer pattern.

The dielectric layer pattern may include a silicon oxide layer.

The dielectric layer pattern may be formed in a serpentine shape.

Based on the foregoing, persons of ordinary skill in the art will appreciate that a capacitor with a higher capacitance may be provided by forming a horizontally folded dielectric layer on a substrate so as to enlarge an effective area of a capacitor in a small space.

It is noted that this patent claims priority from Korean Patent Application Serial Number 10-2004-0115642, which was filed on Dec. 29, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a capacitor, comprising:
   forming a first insulating layer pattern on a silicon substrate;
   epitaxially growing a first silicon epitaxial growth layer on a region of the silicon substrate exposed by the first insulating layer pattern;
   forming a second insulating layer covering the first insulating layer pattern and the first silicon epitaxial growth layer;
   forming a mask on the second insulating layer exposing a surface of the second insulating layer corresponding to the first insulating layer pattern;
   selectively etching the second insulating layer and the first insulating layer pattern using the mask such that a lateral surface of the first silicon epitaxial growth layer is exposed and a second insulating pattern is formed on the first silicon epitaxial growth layer;
   forming a dielectric layer pattern on the exposed lateral surface of the first silicon epitaxial growth layer to form a spacer; and
   epitaxially growing a second silicon epitaxial growth layer on a region of the silicon substrate exposed by both of the dielectric layer pattern and the first silicon epitaxial growth layer, wherein the second silicon epitaxial growth layer is adjacent to and in contact with the dielectric layer pattern.

2. A method as defined in claim 1, wherein the lateral surface of the first insulating layer pattern has a serpentine shape such that the dielectric layer pattern is horizontally folded.

3. A method as defined in claim 1, wherein the second insulating layer pattern remains on the first silicon epitaxial growth layer until after the second silicon epitaxial growth layer is formed.

4. A method as defined in claim 1, wherein forming the dielectric layer pattern comprises: forming a dielectric layer on the first silicon epitaxial growth layer and the second insulating layer pattern; and anisotropically etching the dielectric layer such that the silicon substrate is exposed.

5. A method as defined in claim 1, wherein the dielectric layer pattern comprises a silicon oxide layer.

* * * * *